United States Patent [19]

Suzuki et al.

[11] Patent Number: 4,829,477

[45] Date of Patent: May 9, 1989

[54] SEMICONDUCTOR MEMORY DEVICE

[75] Inventors: Atsushi Suzuki, Kawasaki; Hideo Itoh, Yokohama, both of Japan

[73] Assignee: Fujitsu Limited, Kanagawa, Japan

[21] Appl. No.: 22,291

[22] Filed: Mar. 5, 1987

[30] Foreign Application Priority Data

Mar. 20, 1986 [JP] Japan ................................ 61-064605

[51] Int. Cl.⁴ ................................................. G11C 7/00
[52] U.S. Cl. ................................ 365/189.06; 365/190
[58] Field of Search ............... 365/189, 190, 202, 203, 365/205, 184

[56] References Cited

U.S. PATENT DOCUMENTS 4,062,000 12/1977 Donnelly ............................ 365/203
4,386,419 5/1983 Yamamoto .......................... 365/203

Primary Examiner—Joseph A. Popek
Attorney, Agent, or Firm—Armstrong, Nikaido, Marmelstein, Kubovcik & Murray

[57] ABSTRACT

A semiconductor memory device is provided with a clamp circuit for clamping a driving level of a write circuit so that the information on a bit line can be transmitted quickly to a data bus at the time of a read-out operation by using transistors having a low threshold value (or a large mutual conductance) for the transistors constituting a column transfer gate, and so that a write-in operation can be carried out at a high speed by using transistors having a large mutual conductance for driving transistors of the write circuit and setting a required level by clamping the driving level of the write circuit.

7 Claims, 3 Drawing Sheets

SEMICONDUCTOR MEMORY DEVICE

BACKGROUND OF THE INVENTION

The present invention generally relates to semiconductor memory devices, and more particularly to a static semiconductor memory device in which transistors having a low threshold value are used in a column transfer gate.

In a conventional static random access memory (RAM), static memory cells are coupled to a bit line pair, and first and second transistors are coupled as bit line loads to one end of each of the bit lines on the power source voltage side. A plurality of such bit line pairs are provided, and one specific bit line pair (column) is selected by a column selection signal. The other end of each of the bit lines is coupled to respective data bus via a transistor of a column transfer gate, and a write circuit is coupled to the pair of data buses. The write circuit comprises on the ground side thereof a pair of driving transistors for entering write-in data, and on the power source voltage side thereof a pair of load transistors for coupling to the power source voltage. Word lines are coupled to the corresponding memory cells via a word line driver.

A write-in operation is carried out by selecting one specific word line by a word line selection signal and selecting a specific memory cell by the column selection signal. When one of the two write-in data becomes high, the corresponding data bus and bit line become low so that the write-in of data can be carried out with respect to the specific memory cell.

In this conventional semiconductor memory device, normal enhance transistors are used as the transistors constituting the column transfer gate. But the normal enhance transistor has a relatively high threshold value, and there is a problem in that the information on the bit line cannot be transmitted quickly to the data bus at the time of a read-out operation. In other words, at the time of the read-out operation, the bit line and the data bus have an intermediate level between the power source voltage and ground level, and a voltage level must be transmitted via the column transfer gate which is applied with a relatively low gate bias voltage. As a result, the conductance of the column transfer gate becomes insufficient, and the data transmission does not follow the information on the bit line. Because the bit line pair responds gradually, an access loss and the like occur due to the slow following characteristic.

Hence, in order to improve the speed of the data transmission from the bit line to the data bus, it is possible to conceive a device which uses light dose or non dose transistors (transistors implanted with ions for the purpose of controlling the threshold value) having a low threshold value for the transistors constituting the column transfer gate so as to quickly transmit the information on the bit line to the data bus. However, it was found that the following problems will occur when transistors having a low threshold value (or a large mutual conductance) are used for the transistors constituting the column transfer gate. Firstly, when the mutual conductance of the driving transistors in the write circuit is set to a large value so as to carry out the write-in operation to the memory cell at a high speed, the level of the bit line falls to a low level which is lower than necessary and the write recovery time becomes poor. Secondly, when the mutual conductance of the driving transistors in the write circuit are set to such a value that the level of the bit line does not fall to an unnecessarily low level in order to prevent the write recovery time from becoming poor, the speed of the write-in operation becomes slow.

SUMMARY OF THE INVENTION

Accordingly, it is a general object of the present invention to provide a novel and useful semiconductor memory device in which the problems described heretofore are eliminated.

Another and more specific object of the present invention is to provide a semiconductor memory device provided with a circuit for clamping a driving level of a write circuit. According to the semiconductor memory device of the present invention, it is possible to quickly transmit the information on a bit line to a data bus at the time of a read-out operation, by using transistors having a low threshold value (or a large mutual conductance) for the transistors constituting a column transfer gate. In addition, as for the write recovery time, it is possible to carry out a write-in operation at a high speed by using transistors having a large mutual conductance for driving transistors of the write circuit because a required level can be set by clamping the driving level of the write circuit.

Other objects and further features of the present invention will be apparent from the following detailed description when read in conjunction with the accompanying drawings.

DETAILED DESCRIPTION

Figure 1:
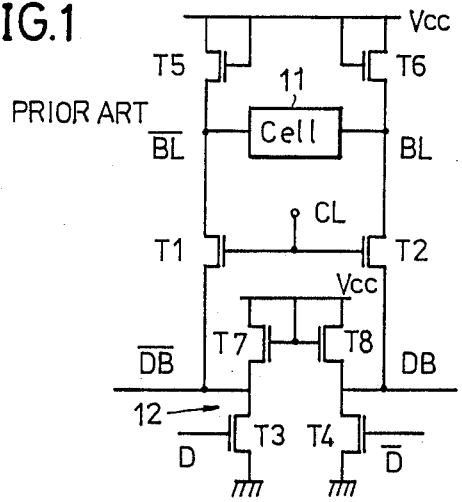
FIG. 1 is a circuit diagram showing an essential part of an example of a conventional semiconductor memory device.

FIG. 1 shows an essential part of an example of a conventional static random access memory (RAM) in a write-in direction along a specific bit line pair. In FIG. 1, a plurality of static memory cells (only a static memory cell 11 shown) are coupled to a pair of bit lines BL and $\overline{BL}$, and transistors T5 and T6 are coupled to one end of the respective bit lines BL and $\overline{BL}$ on a power source voltage Vcc side. One specific bit line pair (BL and $\overline{BL}$) is selected out of a plurality of bit line pairs by a column selection signal CL. The other end of each of the bit lines BL and $\overline{BL}$ is coupled to respective ones of data buses DB and $\overline{DB}$ via a transistor T1 or T2 of a column transfer gate, and a write circuit 12 is coupled to the data buses DB and $\overline{DB}$. The write circuit 12 comprises on the ground GND side thereof driving transistors T3 and T4 for entering write-in data D and $\overline{D}$, and on the power source voltage Vcc side thereof load transistors T7 and T8 for coupling to the power source voltage Vcc. A sense amplifier (not shown) is coupled to the data buses DB and $\overline{DB}$. Word lines (not shown) are coupled to the corresponding memory cells via a word line driver (not shown).

Figure 2A:
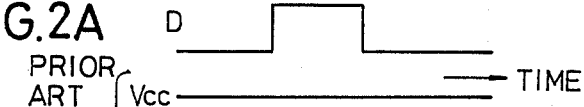
FIGS. 2A and 2B are time charts for explaining the operation of the circuit shown in FIG. 1.
Figure 2B:
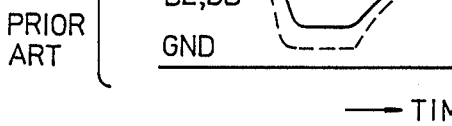

A write-in operation is carried out by selecting one specific word line (not shown) by a word line selection signal and selecting one specific memory cell 11, for example, by the column selection signal CL. When one of the two write-in data D and $\overline{D}$ becomes high, the corresponding data bus and bit line become low so that the write-in of data can be carried out with respect to the specific memory cell 11. FIG. 2A shows the write-in data D and FIG. 2B shows the levels of the bit lines BL and $\overline{BL}$ and the data buses DB and $\overline{DB}$ with reference to the power source voltage Vcc and the ground level GND.

In this conventional semiconductor memory device, normal enhance transistors are used as the transistors T1 and T2 constituting the column transfer gate. But the normal enhance transistor has a relatively high threshold value, and there is a problem in that the information on the bit line cannot be transmitted quickly to the data bus at the time of a read-out operation. In other words, at the time of the read-out operation, the bit line and the data bus (for example, $\overline{BL}$ and $\overline{DB}$ in FIG. 2B) have an intermediate level between the power source voltage Vcc and ground level GND, and a voltage level must be transmitted via the column transfer gate which is applied with a relatively low gate bias voltage. As a result, the conductance of the column transfer gate becomes insufficient, and the data transmission does not follow the information on the bit line. Because the pair of bit lines BL and $\overline{BL}$ respond gradually, an access loss and the like occur due to the slow following characteristic.

Hence, in order to improve the speed of the data transmission from the bit line to the data bus, it is possible to conceive a device which uses right dose or non dose transistors having a low threshold value for the transistors constituting the column transfer gate so as to quickly transmit the information on the bit line to the data bus. However, it was found that the following problems will occur when transistors having a low threshold value (or a large mutual conductance) are used for the transistors T1 and T2 constituting the column transfer gate. Firstly, when a mutual conductance $g_m$ of the transistors T3 and T4 in the write circuit 12 is set to a large value so as to carry out the write-in operation to the memory cell 11 at a high speed, the level of the bit line $\overline{BL}$ falls to a low level which is lower than necessary as indicated by a phantom line in FIG. 2B and the write recovery time becomes poor. Secondly, when the mutual conductance $g_m$ of the transistors T3 and T4 in the write circuit 12 are set to such a value that the level of the bit line $\overline{BL}$ does not fall to an unnecessarily low level as indicated by a solid line in FIG. 2B in order to prevent the write recovery time from becoming poor, the speed of the write-in operation becomes slow.

The present invention eliminates the problems of the conventional semiconductor memory device by providing a circuit for clamping a driving level of the write circuit.

Figure 3:
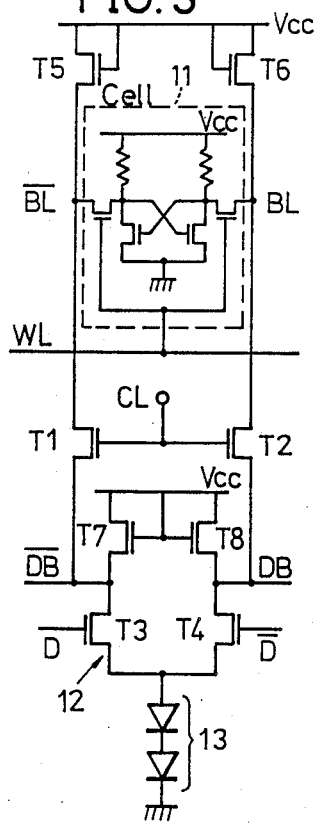
FIG. 3 is a circuit diagram showing an essential part of a first embodiment of the semiconductor memory device according to the present invention.
Figure 4:
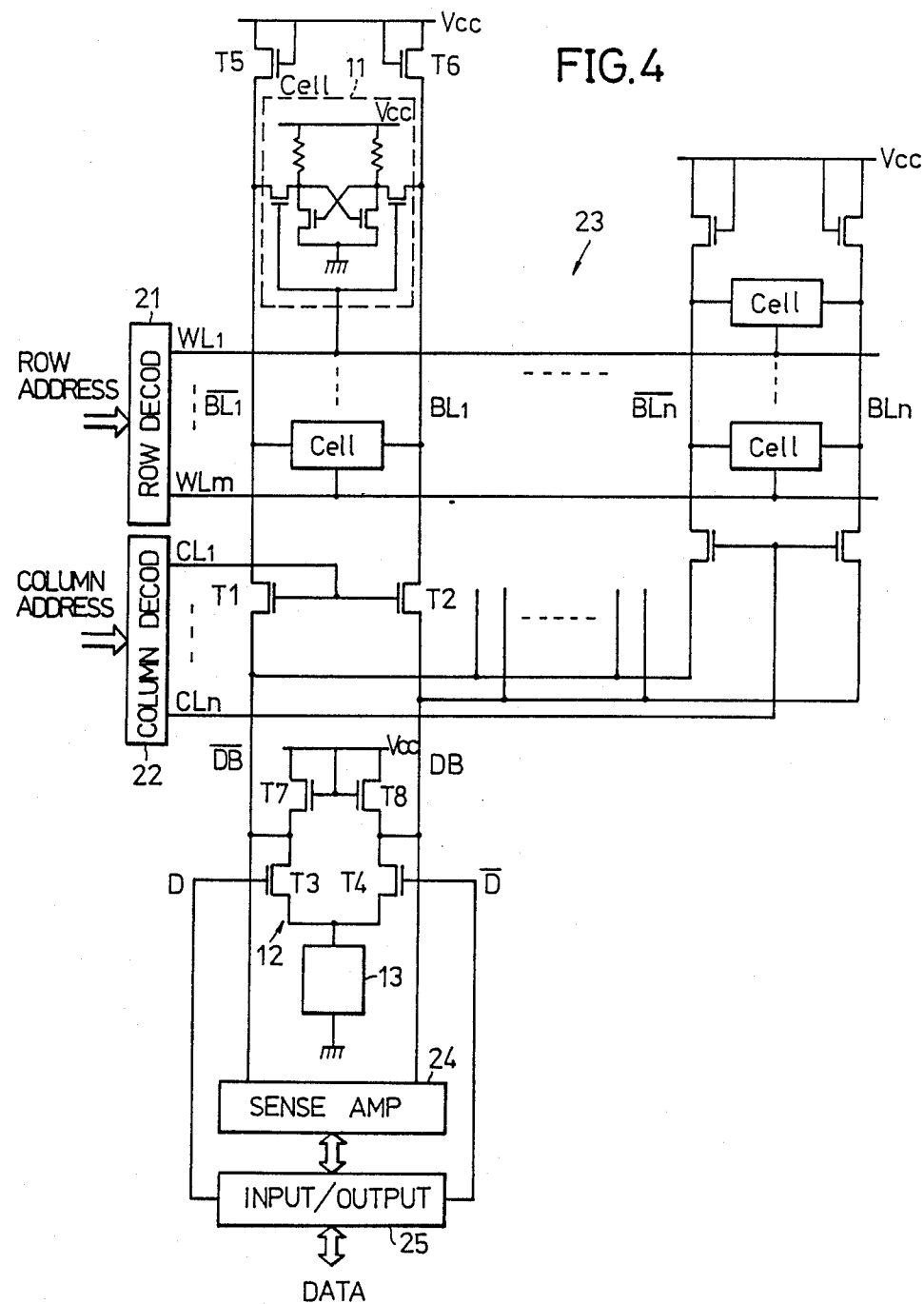
FIG. 4 is a circuit diagram showing the first embodiment together with other essential parts of the memory device.

FIG. 3 shows an essential part of a first embodiment of the semiconductor memory device according to the present invention in a write-in direction along a specific bit line pair. FIG. 4 shows the first embodiment together with other essential parts of the memory device. In FIGS. 3 and 4, those parts which are the same as those corresponding parts in FIG. 1 are designated by the same reference numerals, and description thereof will be omitted.

The static RAM shown in FIG. 4 generally comprises a row address decoder 21 for decoding an incoming row address, a column address decoder 22 for decoding an incoming column address, a memory circuit part 23 including a first bit line pair $BL_l$ and $\overline{BL}_l$ through an n-th bit line pair $BL_n$ and $\overline{BL}_n$, a sense amplifier 24, and an input/output circuit 25. Word lines $WL_l$ through $WL_m$ from the row decoder 21 are each coupled to a corresponding memory cell in each of the n columns (bit line pairs) via a word line driver constituted by a pair of transistors. Column selection signals $CL_l$ through $CL_n$ from the column address decoder 22 are supplied to corresponding ones of the n columns via a column transfer gate. The data buses DB and $\overline{DB}$ and the gates of the transistors T3 and T4 are coupled to the input/output circuit 25. A memory cell in which the write-in data is to be written or from which the stored data is to be read out is designated by the row and columns addresses, and the designated memory cell is selected by driving the word line driver responsive to the decoded row address and driving the column transfer gate responsive to the decoded column address. The write-in data is supplied to the write circuit 12 via the input/output circuit 25, and a read-out data obtained from the data-buses DB and $\overline{DB}$ is supplied to the input/output circuit 25 via the sense amplifier 24.

The present embodiment differs from the conventional memory device shown in FIG. 1 in that the memory device of the present embodiment is provided with a clamp circuit 13. The clamp circuit 13 comprises a predetermined number of stages of forward biased diodes and is coupled to sources of the transistors T3 and T4 of the write circuit 12. In addition, light dose transistors or non dose transistors having a low threshold value are used for the transistors T1 and T2 constituting the column transfer gate.

Figure 6A:
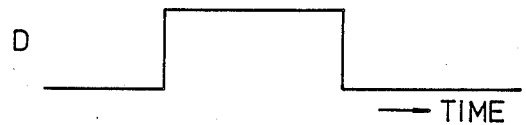
FIGS. 6A and 6B are time charts for explaining the operations of the circuits shown in FIGS. 3 through 5.
Figure 6B:
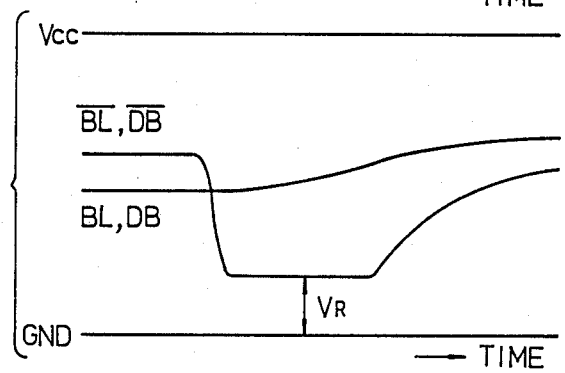

Accordingly, as may be seen from FIGS. 6A and 6B, the write-in level is set to a level $V_R$ which is required for the write-in by the clamp circuit 13 when the write circuit 12 is driven, and the fall of the level of the bit line $\overline{BL}$ to an unnecessarily low level is prevented. For this reason, it is possible to carry out the write-in operation at a high speed by using transistors having a large mutual conductance $g_m$ for the driving transistors T3 and T4 of the write circuit 12, without making the write recovery time poor. Furthermore, at the time of the read-out operation, the information on the bit line can be transmitted to the data bus at a high speed by the transistors of the column transfer gate having the low threshold value (or a large mutual conductance), and it is possible to carry out the read-out operation at a high speed.

Figure 5:
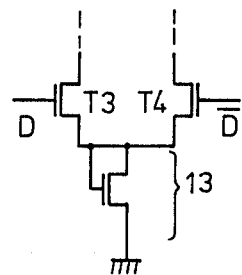
FIG. 5 is a circuit diagram showing an essential part of a second embodiment of the semiconductor memory device according to the present invention.

FIG. 5 shows an essential part of a second embodiment of the semiconductor memory device according to the present invention. In the present embodiment, the clamp circuit 13 is constituted by a predetermined number of stages of transistors having a diode connection, and the number of stages is one in the embodiment shown in FIG. 5. Other parts of the memory device are the same as those of FIGS. 3 and 4, and description thereof will be omitted.

As described heretofore, according to the semiconductor memory device of the present invention, the deterioration in the write recovery time conventionally introduced when the column transfer gate is constituted by transistors having a low threshold value (or a large mutual conductance) is prevented by coupling the clamp circuit to the write circuit. The clamp circuit clamps the driving level of the write circuit so as to prevent the fall of the level of the bit line to an unnecessarily low level, and it is thus possible to carry out the write-in operation at a high speed without deteriorating the write recovery time, even when transistors having a large mutual conductance are used for the driving transistors of the write circuit. At the time of the read-out operation, it is possible to transmit the information on the bit line to the data bus at a high speed by the transistors of the column transfer gate having the low threshold value (or a large mutual conductance).

Further, the present invention is not limited to these embodiments, but various variations and modifications may be made without departing from the scope of the present invention.

What is claimed is:

1. A static semiconductor memory device comprising:
    a row address decoder supplied with a row address for decoding the row address;
    a column address decoder supplied with a column address for decoding the column address;
    a plurality of columns each constituted by a bit line pair;
    a plurality of static memory cell grups each coupled to a corresponding one of bit line pairs constituting said columns, said static memory cell groups respectively comprising a plurality of static memory cells,
    column transfer gate means coupled to each of said bit line pairs for selecting a specific column out of said columns responsive to a decoded output of said column address decoder;
    a plurality of word lines each coupled to a corresponding one of said static memory cells in each of said bit line pairs;
    word line driver means coupled to said word lines for driving a selected word line out of said word lines responsive to a decoded output of said row address decoder;
    a pair of data buses coupled to each of said bit line pairs via said column transfer gate means;
    an input/output circuit for entering a write-in data which is to be written into a selected static memory cell and for outputting a read-out data read out from a selected static memory cell and obtained via said pair of data buses;
    a write circuit coupled to said pair of data buses and a high potential power supply line, for driving said data buses complementarily in accordance with the write-in data to be written into the selected static memory cell designated by the row and column addresses; and
    a clamp circuit connected between said write circuit and a low potential power supply line, for clamping one of the two data buses which has the lower potential during a write-in operation.

2. A static semiconductor memory device as claimed in claim 1 in which said column transfer gate means comprises a plurality of transistor pairs coupled to corresponding ones of said bit line pairs, each of said transistor pairs being constituted by a pair of transistors having a low threshold value and having gates supplied in common with a corresponding bit of the decoded output of said column address decoder.

3. A static semiconductor memory device as claimed in claim 1 in which said column transfer gate means comprises a plurality of transistor pairs coupled to corresponding ones of said bit line pairs, each of said transistor pairs being constituted by a pair of transistors having a large mutual conductance and having gates supplied in common with a corresponding bit of the decoded output of said column address decoder.

4. A static semiconductor memory device as claimed in claim 1 in which said write circuit comprises a pair of driving transistors having a large mutual conductance and gates supplied with the write-in data.

5. A static semiconductor memory device as claimed in claim 4 in which said driving transistors have sources which are connected to each other, said clamp circuit comprising a predetermined number of stages of forward biased diodes coupled between the sources of said driving transistors and ground.

6. A static semiconductor memory device as claimed in claim 4 in which said driving transistors have sources which are connected to each other, said clamp circuit comprising a predetermined number of stages of transistors having a diode connection coupled between the sources of said driving transistors and ground.

7. A write circuit for a semiconductor memory device having a pair of data buses, said write circuit comprising:
    a common node;
    a high potential power supply line;
    a low potential power supply line;
    a first transistor connected between one of said data buses and said common node;
    a second transistor connected between another of said data buses and said common node, said first and second transistors being controlled by a complementary signal in accordance with a write-in data;
    a first load transistor, connected between said first transistor and said high potential power supply line;
    a second load transistor connected between said second transistor and said high potential power supply line; and
    a clamp circuit, connected between said common node and said low potential power supply line, for clamping one of the two data buses which has the lower potential during write-in operation.

* * * * *